United States Patent
Casper

[11] Patent Number: 5,973,992
[45] Date of Patent: *Oct. 26, 1999

[54] TRACKING SIGNALS

[75] Inventor: Stephen L. Casper, Boise, Id.

[73] Assignee: Micron Technology, Inc., Boise, Id.

[ * ] Notice: This patent is subject to a terminal disclaimer.

[21] Appl. No.: 09/207,304

[22] Filed: Dec. 8, 1998

Related U.S. Application Data

[63] Continuation of application No. 08/911,329, Aug. 14, 1997, Pat. No. 5,867,449.

[51] Int. Cl.⁶ ............................................. G11C 8/00
[52] U.S. Cl. ................................. 365/233.5; 365/230.06
[58] Field of Search .......................... 365/233.5, 230.01, 365/230.06, 241, 226; 326/71, 83

[56] References Cited

U.S. PATENT DOCUMENTS

| | | | |
|---|---|---|---|
| 4,514,829 | 4/1985 | Chao | 365/189 |
| 5,567,277 | 10/1996 | Shirley | 365/189.07 |
| 5,633,832 | 5/1997 | Patel et al. | 365/230.06 |
| 5,867,449 | 2/1999 | Casper | 365/233.5 |

*Primary Examiner*—David Nelms
*Assistant Examiner*—David Lam
*Attorney, Agent, or Firm*—Trop, Pruner, Hu & Miles, P.C.

[57] ABSTRACT

Apparatus and method of tracking a wordline signal using a tracking circuit having a first detector biased between a first power supply voltage and a ground voltage, and a second detector biased between a second power supply voltage and the ground voltage. The first power supply voltage is greater than the second power supply voltage. The wordline signal is driven to the first power supply voltage.

6 Claims, 3 Drawing Sheets

5,973,992

TRACKING SIGNALS

This application is a continuation of Ser. No. 08/911,329 filed Aug. 14, 1997 now U.S. Pat. No. 5,867,449.

BACKGROUND

The invention relates to tracking signals.

Memory cells in memory devices, such as dynamic random access memories (DRAMs), are typically arranged in arrays. Portions of an exemplary array 14 in a memory device 8 are shown in FIG. 1. A memory cell, such as cell 18, is selected for access by activation of a wordline signal WLi driven by a row address decoder 10 and activation of a column select signal YSi driven by a column address decoder 12. Each memory cell is connected to one of a pair of bit lines BL and BL__ through a pass transistor, such as n-channel MOSFET 16. The bit lines are connected to sense amplifiers 20, which when activated drive BL and BL__ to opposite states depending on the charge stored in the connected memory cell.

Upon completion of an access to the array 14, the sense amplifiers 20 are shut off. To ensure that each bit line pair EL/BL__ is precharged to a known state, a signal decoder 22 drives a precharge activation signal P1 to the sense amplifiers 20 to equalize the bit lines BL and BL__, typically to half an internal power supply voltage Vccr. Thus, when the array 14 is inactive, the bit lines are maintained at the equalization voltage (Veq).

When a wordline signal WLi is driven high (typically to an elevated voltage Vccp that is greater than the internal power supply voltage Vccr, as shown in FIG. 2), all the pass transistors connected to the wordline signal are activated. As a result, the charges stored in the selected memory cells flow onto corresponding bit lines BL or BL__. In the timing diagram shown in FIG. 2, the cell 18 is assumed to contain a "0" charge, which causes the bit line BL to be pulled lower than the complementary bit line BL__. If the cell 18 contains a "1", then the bit line BL would be pulled to a slightly higher voltage then BL__.

After the wordline signal WLi is turned on, the sense amplifiers 20 are activated by a strobe signal S1 driven by the signal decoder 22. At some later time, the column decoder 12 asserts one of the column select signals YSi to output the selected bit onto input/output lines IOi and IOi__ connected to the outputs of the sense amplifiers 20.

Referring to FIG. 3, a tracking circuit 24 is shown that has been used in some DRAM devices to track the wordline signals to control the strobe signal S1 and precharge activation signal P1. An RC network 100 models the resistance and capacitance of a wordline signal WLi, the RC network providing a signal MWL that is driven by a model wordline driver 23 from row control signals. The capacitance of the network 100 is obtained by connecting an n-channel MOSFET 101 having the equivalent width of the multiple n-channel MOSFETs connected to a wordline WLi in the array 14.

The tracking circuit 24 includes a low trip point detector 130 having p-channel MOSFETs 102 and 104 and n-channel MOSFETs 106 and 108 connected in series between Vccr and Vss, as well as a high trip point detector 132 having p-channel MOSFETs 110 and 112 and n-channel MOSFETs 114 and 116, also connected in series between Vccr and Vss. The model wordline signal MWL is connected to the gate of each of the MOSFETs 104, 106, 112 and 114. The sources of p-channel MOSFETs 104 and 112 and the drains of n-channel MOSFETs 106 and 114 are connected to a common node N1, which is further connected to the input of an inverter 118. The output of the inverter 118 is connected to the gates of p-channel MOSFET 110 and n-channel MOSFET 108, as well as to the input of an inverter 120. The output of the inverter 120 is connected to the gates of n-channel MOSFET 116 and p-channel MOSFET 102, as well as to an inverter 122, which outputs a signal WLTRACK used by the signal decoder 22 to control S1 and P1.

The transistors 110, 112, 114, and 116 are sized to provide a relatively high trip point; that is, the output driven by the MOSFETs 110, 112, 114, and 116 does not transition low in response to the model wordline signal MWL transitioning high until it reaches a predetermined high voltage. The transistors 102, 104, 106, and 108 are sized to provide a low trip point; that is, the output driven by the MOSFETs 102, 104, 106, and 108 does not transition high in response to the signal MWL transitioning low until it has reached a predetermined low voltage. In this manner, the signal WLTRACK is not asserted or deasserted until the signal MWL has transitioned to predetermined voltage levels.

SUMMARY

The invention may have one or more of the following advantages. By more accurately tracking the low-to-high and high-to-low transitions of the wordline signal, the likelihood that the states of storage cells of memory devices are corrupted by sense amplifiers being prematurely turned on or by bit lines being prematurely precharged is reduced. A more reliable method is provided to monitor a signal reaching a predetermined high voltage when transitioning from low to high.

In general, in one aspect, the invention features a circuit for tracking a signal for use in an integrated circuit device. The circuit includes a first detector connected to detect the signal rising to a first predetermined voltage, the first detector being biased between a first power supply voltage and a ground voltage. A second detector is connected to detect the signal falling to a second predetermined voltage, the second detector being biased between a second power supply voltage and the ground voltage. The first power supply voltage is greater than the second power supply voltage.

In general, in another aspect, the invention features an integrated circuit having a first high supply voltage and a second high supply voltage, the second high supply voltage being lower then the first high supply voltage. The integrated circuit includes a signal driver responsive to input signals driven to the second high supply voltage and connected to drive an output signal to the first high supply voltage. A detector is connected to the first high supply voltage to detect the output signal rising to a predetermined voltage level.

In general, in another aspect, the invention features a circuit for tracking a signal that includes a first inverter having its input connected to the signal. The first inverter is connected to a first high supply voltage. The circuit also includes a second inverter having its input connected to the signal, and the second inverter is connected to a second high supply voltage. The first high supply voltage is greater than the second high supply voltage.

In general, in another aspect, the invention features a memory device including a signal driver connected to a first high supply voltage for driving a wordline signal. The memory device also includes a tracking circuit having a first detector connected to the first high supply voltage and receiving the wordline signal. A second detector is connected to a second high supply voltage and receives the wordline signal. The second high supply voltage is different then the first high supply voltage.

In general, in another aspect, the invention features a memory device having a wordline driver connected to a first high supply voltage for driving a wordline signal. Bit lines are precharged to an equalization voltage when in-active. Sense amplifiers connected to a second, different high supply voltage and connected to sense voltage levels on the bit lines are activated by a strobe signal. A tracking circuit has a detector connected to the first high supply voltage to detect the wordline signal rising to a predetermined voltage above the equalization voltage to control activation of the strobe signal.

In general, in another aspect, the invention features a method of tracking a signal in an integrated circuit device. The method detects the signal rising to a first voltage using a first detector connected to a first high supply line. The signal falling to a second voltage is also detected using a second detector connected to a second high supply line. The first high supply line has a voltage greater than that of the second high supply line.

In general, in another aspect, the invention features a method of activating a sense amplifier in a memory device having a memory cell that is coupled to the sense amplifier by asserting a wordline signal. The method includes detecting the wordline signal rising to a predetermined voltage using a detector connected to a first high supply voltage that is greater than a second high supply voltage used to power other elements in the memory device. The sense amplifier is activated after the wordline signal has reached the predetermined voltage.

In general, in another aspect, the invention features an input signal tracking circuit for use in an integrated circuit. The tracking circuit includes a first trip point detector and a second trip point detector connected to receive the input signal. The first trip point detector is biased by a higher voltage than the second trip point detector.

In general, in another aspect, the invention features a method for use in a memory device of detecting activation of a wordline signal that is activated to a first voltage level. A detector is biased to the first voltage level, and an indication is asserted when the detector detects the wordline signal rising to a predetermined voltage.

DETAILED DESCRIPTION

Figure 1:
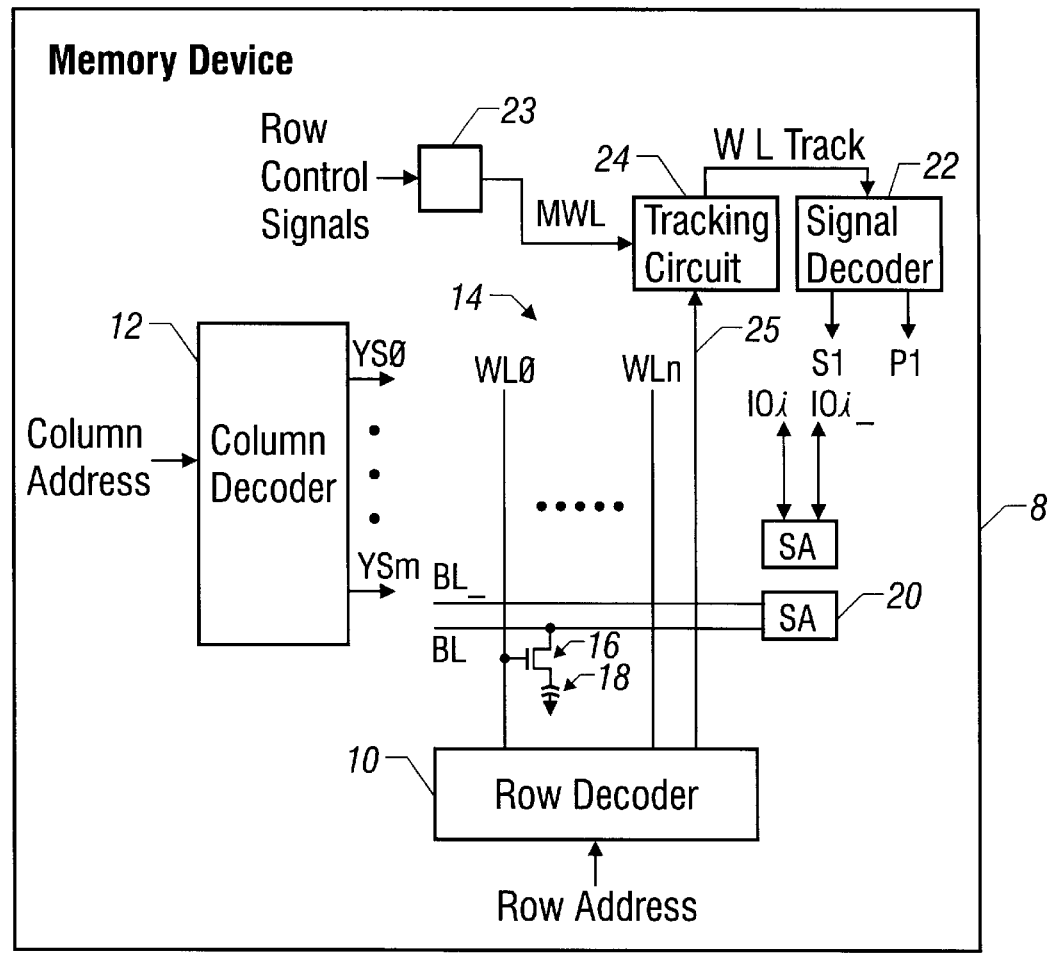
FIG. 1 is a diagram of a portion of a memory array.
Figure 2:
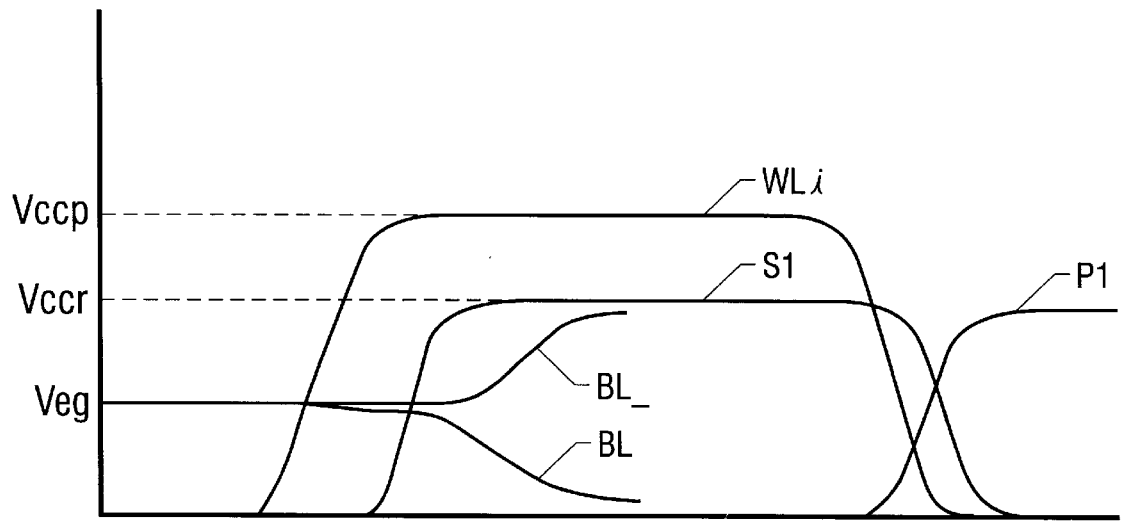
FIG. 2 is a timing diagram of bit lines, wordlines, and sense amp strobe and precharge signals.
Figure 4:
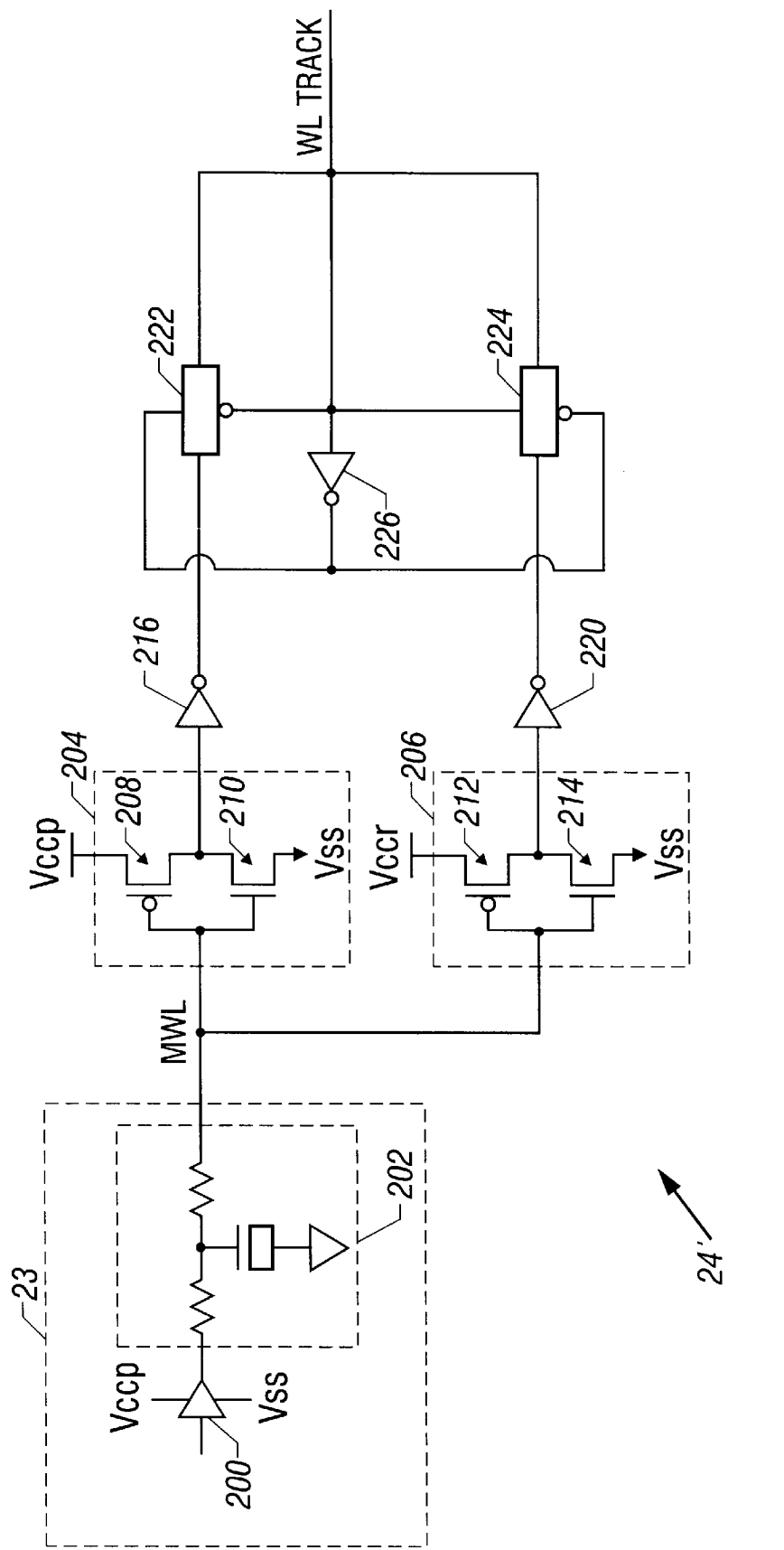
FIG. 4 is a schematic diagram of a wordline signal tracking circuit according to one embodiment of the present invention.

Referring to FIG. 4, a wordline tracking circuit 24' for use in a memory device having improved signal tracking characteristics is shown. The improved tracking circuit 24' can be used with the circuitry of the memory device 8 shown in FIG. 1 as the tracking circuit 24. The memory device 8 can be a dynamic random access memory (DRAM) or other variations of a DRAM, such as a synchronous DRAM, video RAM, and so forth.

The model wordline driver 101 includes a driver 200 (which can be implemented as one or more inverters) connected to drive the model wordline MWL, which has the resistance and capacitance in an RC network 202. The capacitance of MWL is modeled using a single n-channel MOSFET. Alternatively, the RC network 202 can be broken into multiple RC components. Another possible way of modeling the behavior of the wordlines is to route the model wordline signal as a separate line through the array 14, shown as element 25 in FIG. 1. The number of transistors connected to the model wordline 25 is the same as any other wordline WLi.

The power supply terminals of the driver 200 is connected to Vccp and Vss. The voltage Vss is provided by ground reference lines in the memory device 8, with the ground reference lines being ultimately connected to system ground through external pins of the memory device.

The power supply voltage Vccp (driven by a pump circuit) is an elevated supply voltage that is typically two n-channel transistor threshold voltages Vtn above Vccr, which is the supply voltage used by most other components in the memory device. In some low voltage memory devices, the voltage Vccr typically ranges between 3 and 4 volts. To further reduce power consumption, the internal power supply voltage Vccr of other memory devices has been set at about 2 volts. In yet other memory devices, the internal Vccr voltage is equal to the external Vcc voltage, which can be either 5 volts or between 3 and 4 volts.

To ensure that the strobe signal S1 turns on only after the wordline signal WLi has turned on a pass transistor, such as the transistor 16, the wordline signal tracking circuit 24' is connected to the model wordline signal MWL.

The tracking circuit 24' monitors the transitions of the model wordline signal MWL, and outputs a signal WLTRACK that is provided to an input of the signal decoder 22. When the model wordline signal MWL transitions to a predetermined high voltage, the wordline tracking circuit 24' drives its output signal WLTRACK high to indicate to the signal decoder 22 that a wordline signal WLi has been activated. This enables the signal decoder 22 to assert the strobe signal S1 to activate the sense amplifiers 20. On the reset side, when the model wordline signal MWL transitions to a predetermined low voltage, the wordline tracking circuit 24' drives the signal WLTRACK low to indicate that the wordline signal WLi has been deasserted. This enables the signal decoder 22 to assert the precharge signal P1 to equalize bit lines BL and BL_.

The signal MWL is provided to inputs of two inverters 204 and 206 in the tracking circuit 24', with the inverter 204 having a high trip point and the inverter 206 having a low trip point. The inverter 204 tracks the low-to-high transition of the model wordline signal MWL, while the inverter 206 tracks-the high-to-low transition of MWL.

The inverter 204 includes a p-channel MOSFET 208 and an n-channel MOSFET 210 connected between a first "high" supply voltage, such as the elevated supply voltage Vccp, and a "low" supply voltage, such as Vss, and the inverter 206 includes a p-channel MOSFET 212 and an n-channel MOSFET 214 connected between a second, different "high" supply voltage, such as the internal supply voltage Vccr, and a "low" supply voltage, such as Vss. Connecting the inverter 204 to the elevated supply voltage Vccp allows the inverter 204 to more reliably trip at a predetermined high input voltage.

The terms "supply voltage" as used herein refers to any voltage that is used to connect to circuitry to enable the circuitry to drive signals to the connected supply voltage. Thus, for example, the supply voltages include Vccr, Vss, Vccp, and external Vcc.

The inverter 204 can alternatively be connected to an alternate high supply voltage, such as external Vcc, in low voltage memory devices, and the inverter 206 remains connected to the internal, reduced voltage Vccr.

To ensure that the pass transistors connected to the storage cells of the array 14 are completely turned on before the sense amplifiers 20 are activated, the inverter 204 trips at a voltage that is approximately half Vccr (the equalization voltage Veq of the bit lines BL and BL_) plus a threshold voltage Vtn of an n-channel MOSFET. To provide a high trip point, the width of the p-channel MOSFET 208 is selected to be greater than 2 times the width of the n-channel MOSFET 210. For example, an exemplary ratio of the width of the p-channel MOSFET 208 to that of the n-channel MOSFET 210 is 6. By tying the drain of the p-channel MOSFET 208 to an elevated voltage such as Vccp, the inverter 204 can be built to more reliably trip at the predetermined high voltage, such as Veq+Vtn.

The width of the p-channel MOSFET 212 in the inverter 206 is selected to be less than the width of the n-channel MOSFET 214. An exemplary ratio is 1:4 (that is, the width of the n-channel MOSFET 214 is four times greater than the width of the p-channel MOSFET 212). An exemplary trip point for the inverter 206 is approximately Vtn.

The outputs of the inverters 204 and 206 are connected through inverters 216 and 220, respectively, to transfer gates 222 and 224, each made up of an n-channel MOSFET and a p-channel MOSFET connected in parallel. The outputs of the transfer gates 222 and 224 are connected to a common node, represented as signal WLTRACK.

The signal WLTRACK is connected to control which of the two transfer gates 222 and 224 is turned on, with the signal WLTRACK connected to the gate of the n-channel MOSFET in the transfer gate 224 and to the gate of the p-channel MOSFET in the transfer gate 222. The signal WLTRACK is inverted by an inverter 226, with the output of the inverter connected to the gate of the n-channel MOSFET in the transfer gate 222 and the gate of the p-channel MOSFET in the transfer gate 224.

Thus, when the model wordline signal MWL is initially low, the signal WLTRACK is low, in which case the transfer gate 222 is on and the transfer gate 224 is off. As the signal MWL transitions from low to high, the inverter 206 transitions first because of its low trip point, causing the inverter 220 to drive its output high. At this time, because the signal WLTRACK is still low, the transfer gate 224 remains off. When the signal MWL reaches the high trip point voltage (e.g., Veq+Vtn), the inverter 204 transitions to drive the signal WLTRACK high through the pass gate 222, which then causes the transfer gate 224 to turn on and the transfer gate 222 to shut off. As the inverter 220 is already driving its output node high, the signal WLTRACK remains driven high through the transfer gate 224. In effect, the signal WLTRACK does not go high until the inverter 204 trips at the high trip point voltage set at approximately Veq+Vtn.

On the high-to-low edge of the signal MWL, the inverter 204 transitions first because of its high trip point, which causes the inverter 216 to drive its output node low before the inverter 220 does. The transfer gate 222 remains off at this time. When the signal MWL reaches the low trip point voltage, set at about Vtn, the inverter 206 drives its output high, which causes the inverter 220 to drive the signal WLTRACK low through the transfer gate 224. The transfer gate 224 is then shut off and the transfer gate 222 is turned on. As a result, the signal WLTRACK is maintained low. In effect, the signal WLTRACK does not deassert until MWL has reached a sufficiently low voltage to ensure that the pass transistors connected to the storage cells have shut off.

An improved signal tracking circuit has been described that offers accurate tracking of the wordline signal. This is accomplished by using an elevated power supply voltage as the supply for a first detector connected to detect a predetermined high voltage, while a second detector connected to detect a predetermined low voltage is tied to a second supply voltage that is lower than the elevated voltage.

Although the tracking circuit has been described in connection with monitoring the wordline signal used to drive the transistors connected to storage cells in the array, a similar circuit can be used to track other signals in a memory device.

Figure 3:
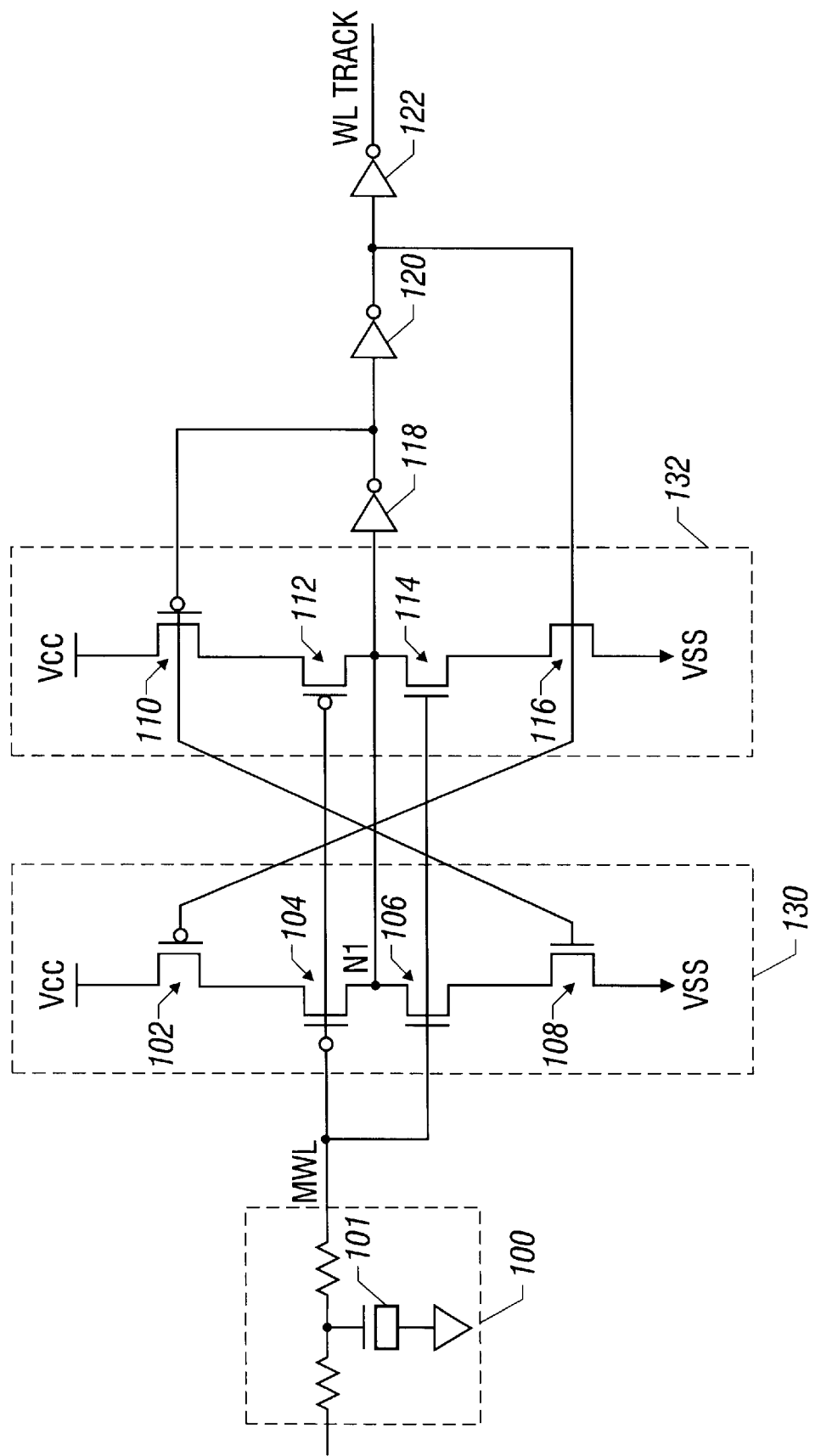
FIG. 3 is a diagram of a prior art wordline signal tracking circuit.

Other embodiments are within scope of the following claims. Instead of using inverters to detect the voltage level of the wordline signal, different detectors can be used. For example, the detectors shown in FIG. 3 can be used, with the high trip point detector 132 reconnected to an elevated power supply voltage, such as Vccp. The signal tracking circuit can also be used in any integrated circuit (e.g., microcontrollers, microprocessors, erasable programmable read-only memories) where tracking of a particular signal is desirable.

What is claimed is:

1. A device comprising:
   a driver that produces a first signal;
   a first switching circuit coupled to a first supply voltage and responsive to the first signal crossing a first trip voltage; and
   a second switching circuit coupled to a second supply voltage and responsive to the first signal crossing a second trip voltage different form the first trip voltage,
   both the first and second switching circuits driving an indication signal based on transitions of the first signal.

2. The device of claim 1, further comprising:
   circuitry activated in response to the indication signal.

3. A memory device comprising:
   a memory array having a plurality of row lines;
   a first decoder coupled to a first supply voltage to detect a predetermined one of the row lines rising to a first predetermined voltage; and
   a second decoder coupled to a second, different supply voltage to detect the predetermined row line falling to a second predetermined voltage, and
   the first and second decoders activating and deactivating a common tracking signal in response to the transitions of the predetermined row line.

4. The memory device of claim 3, wherein the memory array further includes sense amplifiers activated in response to the tracking signal.

5. A method of controlling access to a memory array in a device, comprising:
   driving a tracking signal to a first state if a first tracking circuit coupled to a first supply voltage detects an input signal rising above a first trip point; and driving the tracking signal to a second state if a second tracking circuit coupled to a second, different supply voltage detects the input signal falling below a second trip point; and
   activating and deactivating circuitry in the memory array based on states of the tracking signal.

6. A method of tracking a word line signal in a device, comprising;
   detecting the word line signal rising to a first trip voltage between a first supply voltage and a low voltage;
   detecting the word line signal falling to a second trip voltage between a second, different supply voltage and the low voltage; and
   driving a tracking signal to predetermined states in response to detecting the wordline signal rising to the first trip voltage and falling to the second trip voltage.

* * * * *